US008847810B2

(12) United States Patent
Yamauchi

(10) Patent No.: US 8,847,810 B2
(45) Date of Patent: Sep. 30, 2014

(54) PULSE PHASE DIFFERENCE CODING CIRCUIT

(75) Inventor: Shigenori Yamauchi, Nisshin (JP)

(73) Assignee: Denso Corporation, Kariya (JP)

( * ) Notice: Subject to any disclaimer, the term of this patent is extended or adjusted under 35 U.S.C. 154(b) by 524 days.

(21) Appl. No.: 13/312,168

(22) Filed: Dec. 6, 2011

(65) Prior Publication Data

US 2012/0139772 A1 Jun. 7, 2012

(30) Foreign Application Priority Data

Dec. 7, 2010 (JP) ................................ 2010-272594

(51) Int. Cl.
*H03M 1/60* (2006.01)
*G08C 19/12* (2006.01)

(52) U.S. Cl.
CPC .................................... *G08C 19/12* (2013.01)
USPC .............. 341/157; 341/155; 377/43; 327/269

(58) Field of Classification Search
USPC .............. 341/155, 157, 182; 377/43; 327/269
See application file for complete search history.

(56) References Cited

U.S. PATENT DOCUMENTS 5,128,624 A * 7/1992 Hoshino et al. .................. 327/3
5,528,200 A * 6/1996 Yamauchi et al. .............. 331/45
5,534,809 A * 7/1996 Watanabe et al. ............. 327/269
5,568,071 A * 10/1996 Hoshino et al. ................. 377/43
5,619,134 A * 4/1997 Watanabe et al. ............. 324/225
7,864,093 B2 * 1/2011 Oba ............................. 341/157
2007/0103356 A1 * 5/2007 Makino et al. ................ 341/155
2007/0268172 A1 * 11/2007 Watanabe ..................... 341/155

FOREIGN PATENT DOCUMENTS

JP 6-283984 10/1994

* cited by examiner

*Primary Examiner* — Albert Wong

(74) *Attorney, Agent, or Firm* — Harness, Dickey & Pierce, PLC

(57) ABSTRACT

In a pulse phase difference coding circuit, a count unit includes a plurality of partial counters connected to each other in series so that the most significant bit of an output of the previous stage serves as an operation clock of the subsequent stage. A circulation number detecting unit includes a first latch circuit which is provided for each of the partial counters and latches an output of the partial counter according to a pulse for measurement, and a first delay circuit which treats the partial counter in the second stage or later as an object counter and delays the pulse for measurement by a total delay time in all the partial counters located at the previous stages of the object counter. The pulse for measurement is inputted into the first latch circuit which latches an output of the object counter.

6 Claims, 3 Drawing Sheets

PULSE PHASE DIFFERENCE CODING CIRCUIT

CROSS-REFERENCE TO RELATED APPLICATION

This application is based on and claims the benefit of priority from earlier Japanese Patent Application No. 2010-272594 filed Dec. 7, 2010, the description of which is incorporated herein by reference.

BACKGROUND

1. Technical Field

The present invention relates to a pulse phase difference coding circuit which uses a pulse delay circuit formed by connecting a plurality of delay elements in a ring shape to code the phase difference of a pulse signal.

2. Related Art

Conventionally, pulse phase difference coding circuits are known. In a pulse phase difference coding circuit (which is disclosed in, for example, JP-A-6-283984), a pulse delay circuit is used which is formed by connecting a plurality of delay elements in a ring shape. When a pulse for activation is inputted, the pulse delay circuit is activated. When a pulse for measurement is inputted, the position of a pulse signal circulating in the pulse delay circuit and the number of circulations of the pulse signal are detected. The detection results are coded into numeric data corresponding to the number of stages of delay units through which the pulse signal has passed in the pulse delay circuit during the time period between the input of the pulse for activation and the input of the pulse for measurement. The numeric data is outputted.

The above pulse phase difference coding circuit is used in a so time measurement device which measures the period of time between the input of a pulse for activation and the input of a pulse for measurement. In addition, the pulse phase difference coding circuit is also used in an AD conversion device, which outputs numeric data corresponding to the voltage level of the driving voltage, by being configured so that the delay time of a delay element varies depending on the driving voltage and being operated in a state where an interval between the input of the pulse for activation and the input of the pulse for measurement is fixed.

In the above pulse phase difference coding circuit, a synchronous counter is generally used as a means for counting the number of circulations of the pulse signal.

The rate of operation of the synchronous counter is limited by the delay time of a carry line. Hence, as the number of digits of the synchronous counter increases, the rate of operation thereof is required to be decreased (that is, the period of an operation clock is required to be extended).

Note that, when the measurement time period is required to be extended in a case where the pulse phase difference coding circuit is used as a time measurement circuit, or when the measurement resolution is required to be improved in a case where the pulse phase difference coding circuit is used as an AD conversion circuit, the number of digits of a counter counting the number of circulations of the pulse signal is required to be increased.

If the number of digits of the counter is increased, the rate of operation of the counter is limited as described above. Hence, in order to extend the period of an operation clock of the counter, the number of delay elements configuring the pulse delay circuit is required to be increased.

However, as the number of delay elements is increased, the size of a circuit detecting the position of a circulating pulse signal and the size of a circuit coding the detected position of the circulating pulse signal into numeric data increase, which increases the size of the pulse phase difference coding circuit and power consumption.

In addition, when configuring the pulse delay circuit with an FPGA (Field Programmable Gate Array), all the delay elements configuring the pulse delay circuit are desired to be arranged in the same logical block.

This is because the delay is increased where the delay elements straddle the logical block compared with where the delay elements are placed in the same logical block, which makes the delays in the individual delay elements nonuniform, thereby lowering accuracy of measurement.

However, if the pulse delay circuit is arranged in a single logical block, a matter of ten-odd rings can be made by using an existing FPGA.

As described above, when the number of the delay elements configuring the pulse delay circuit cannot be increased for some reason, the number of digits of the counter circuit is limited. Hence, the performance of the pulse phase difference coding circuit cannot be improved, which considerably limits the use for the pulse phase difference coding circuit.

SUMMARY

An embodiment provides a pulse phase difference coding circuit which reduces the number of delay elements configuring a pulse delay circuit without lowering the performance of the pulse phase difference coding circuit.

As an aspect of this embodiment, a pulse phase difference coding circuit is provided, including: a pulse delay circuit which is formed by connecting a plurality of delay elements in a ring shape, and transmits a pulse signal with the pulse signal being delayed by the delay elements after a pulse for activation representing an activation timing is inputted; a count unit which counts the number of circulations of the pulse signal in the pulse delay circuit; a circulation position detecting unit which detects the position of the pulse signal circulating in the pulse delay circuit when a pulse for measurement representing a measurement timing is inputted; a circulation number so detecting unit which detects the number of circulations of the pulse signal in the pulse delay circuit when the pulse for measurement is inputted; and a coding unit which outputs numeric data representing the number of stages of the delay elements through which the pulse signal has passed in the pulse delay circuit during the time period between the input of the pulse for activation and the input of the pulse for measurement, based on the position of the pulse signal detected by the circulation position detecting unit and the number of circulations detected by the circulation number detecting unit; wherein the count unit includes a plurality of partial counters connected to each other in series so that the most significant bit of an output of the previous stage serves as an operation clock of the subsequent stage, and the circulation number detecting unit includes: a first latch circuit which is provided for each of the partial counters and latches an output of the partial counter according to the pulse for measurement, and a first delay circuit which treats the partial counter in the second stage or later as an object counter and delays the pulse for measurement by a total delay time in all the partial counters located at the previous stages of the object counter, the pulse for measurement being inputted into the first latch circuit which latches an output of the object counter.

DETAILED DESCRIPTION OF THE PREFERRED EMBODIMENTS

With reference to the accompanying drawings, hereinafter are described embodiments. Throughout the drawings, components identical with or similar to each other are given the same numerals for the sake of omitting unnecessary explanation.

(Entire Configuration)

Figure 1:
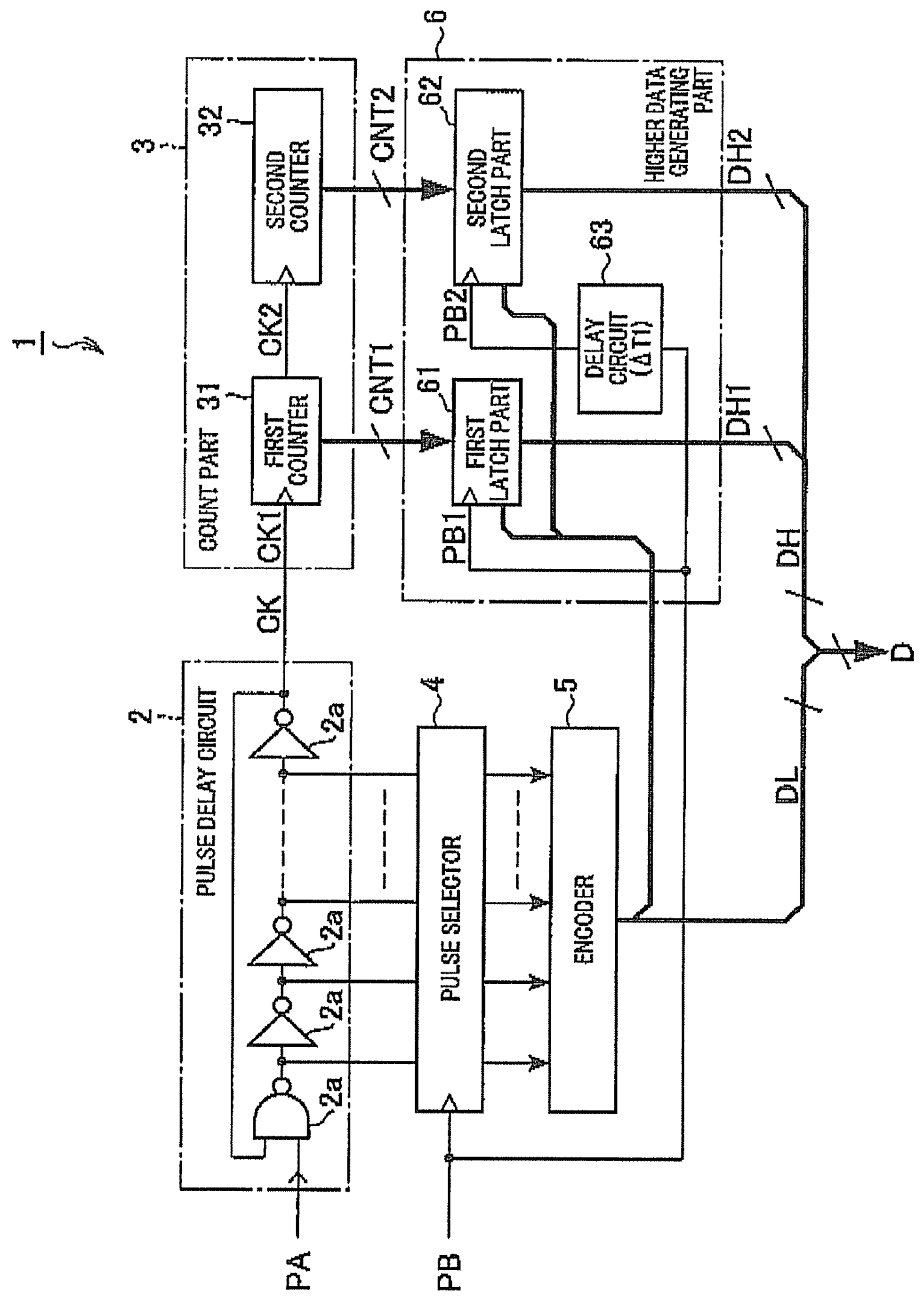
FIG. 1 is a block diagram showing an entire configuration of a pulse phase difference coding circuit.

FIG. 1 is a block diagram showing an entire configuration of a pulse phase difference coding circuit 1 which codes a phase difference between a pulse for activation PA (activation pulse PA) and a pulse for measurement PB (measurement pulse PB) into numeric data.

As shown in FIG. 1, the pulse phase difference coding circuit 1 is configured with a ring delay line (RDL) formed by connecting a plurality of delay elements 2*a* in a ring shape. The pulse phase difference coding circuit 1 includes a pulse delay circuit 2 and a count part 3. When the pulse for activation PA is inputted into the pulse delay circuit 2 from an external unit, the pulse delay circuit 2 transmits pulse signals in sequence with delay. The count part 3 generates count values CNT (CNT1, CNT2) consisting of digital data, which is a binary number, representing the number of circulations of the pulse signal in the pulse delay circuit 2, based on an output CK of the pulse delay circuit 2 by counting the number of inversions of the signal level of the output CK.

The delay elements 2*a* configuring the pulse delay circuit 2 consist of one negative AND circuit (NAND gate) and a plurality of inverter circuits (INV gate). The negative AND circuit receives the pulse for activation PA via one input terminal thereof and is thereby activated. The pulse delay circuit 2 outputs an output of the INV gate (delay element in the last stage), which is provided in the previous stage of the NAND gate (delay element in the first stage), as an operation clock CK.

The pulse phase difference coding circuit 1 includes a pulse selector 4, an encoder 5, and a higher data generating part 6. The pulse selector 4 receives the outputs of the delay elements 2*a* configuring the pulse delay circuit 2 at the timing of the pulse for measurement PB inputted from an external unit. The pulse selector 4 generates position identifying signals which identify the position of a pulse signal circulating in the pulse delay circuit 2 (the delay element whose input and output have the same signal level) based on the signal level of the received output. The encoder 5 generates digital data corresponding to the position identifying signals received from the pulse selector 4 (numeric data representing the number of the stage at which the identified delay element is positioned when counting from the first delay element) and outputs the digital data as lower measurement data DL representing lower bits of the measurement data D. The higher data generating part 6 latches the count values CNT (CNT1, CNT2) outputted from the count part 3 on the timings of the pulse for measurement PB and outputs the count values as upper measurement data DH (DH1, DH2) representing upper bits of the measurement data ID.

Note that the pulse phase difference coding circuit 1 is realized by an FPGA (Field Programmable Gate Array). In particular, all the delay elements 2*a* configuring the pulse delay circuit 2 are designed so as to be arranged in the same logical block of the FPGA. Hence, the number of the delay elements 2*a* is limited by the size of the logical block.

Hereinafter, parts of the pulse phase difference coding circuit 1 will be described. Since the configurations of the pulse delay circuit 2, the pulse selector 4, and the encoder 5 are the same as those of the conventional pulse phase difference coding circuit such as the circuit disclosed in JP-A-6-283984, the details thereof are omitted.

(Count Part)

The count part 3 includes a first counter 31 and a second counter 32 which are configured with synchronous counters. The first counter 31 performs counting by using the output CK of the pulse delay circuit 2 as an operation clock CK1. The second counter 32 performs counting by using the most significant bit (or carry-out) of the first counter 31 as an operation clock CK2.

Note that the number of digits of the first counter 31 is set so that the delay time ΔT1 in the first counter 31 (the period of time required for determining the signal level of the most significant bit from the time when the operation clock CK1 is inputted) becomes so shorter than an interval between edges of the operation clock CK1 at which the signal level varies.

That is, the upper limit of the number of digits K1 of the first counter 31 is limited by the interval between edges of the operation clock CK1, in addition to the number of the delay elements 2*a* configuring the pulse delay circuit 2 and the delay time in each of the delay elements 2*a*.

In addition, the number of digits K2 of the second counter 32 is also set so that the delay time ΔT2 in the second counter 32 becomes shorter than an interval between edges of the operation clock CK2. Note that since the interval between edges of the operation clock CK2 becomes $2^{K1}$ times that of the operation clock CK1, the second counter 32 having the number of digits more than that of the first counter 31 can be used.

(Upper Bits Generating Part)

The higher data generating part 6 includes a first latch part 61, a delay circuit 63, and a second latch part 62. The first latch part 61 latches the lower count value CNT1, which is a count value of the first counter 31, at the timing of the pulse for measurement PB (or referred to as "latch pulse PB1"). The delay circuit 63 generates a latch pulse PB2 which is delayed with respect to the latch pulse PB1 by the delay time ΔT1 in the first counter 31. The second latch part 62 latches the upper count value CNT2, which is a count value of the second counter 32, at the timing of the latch pulse PB2.

Note that the data DH1 outputted from the first latch part 61 configures lower bits of the upper measurement data DH. The data DH2 outputted from the second latch part 62 configures upper bits of the upper measurement data DH.

(Latch Part)

Figure 2:
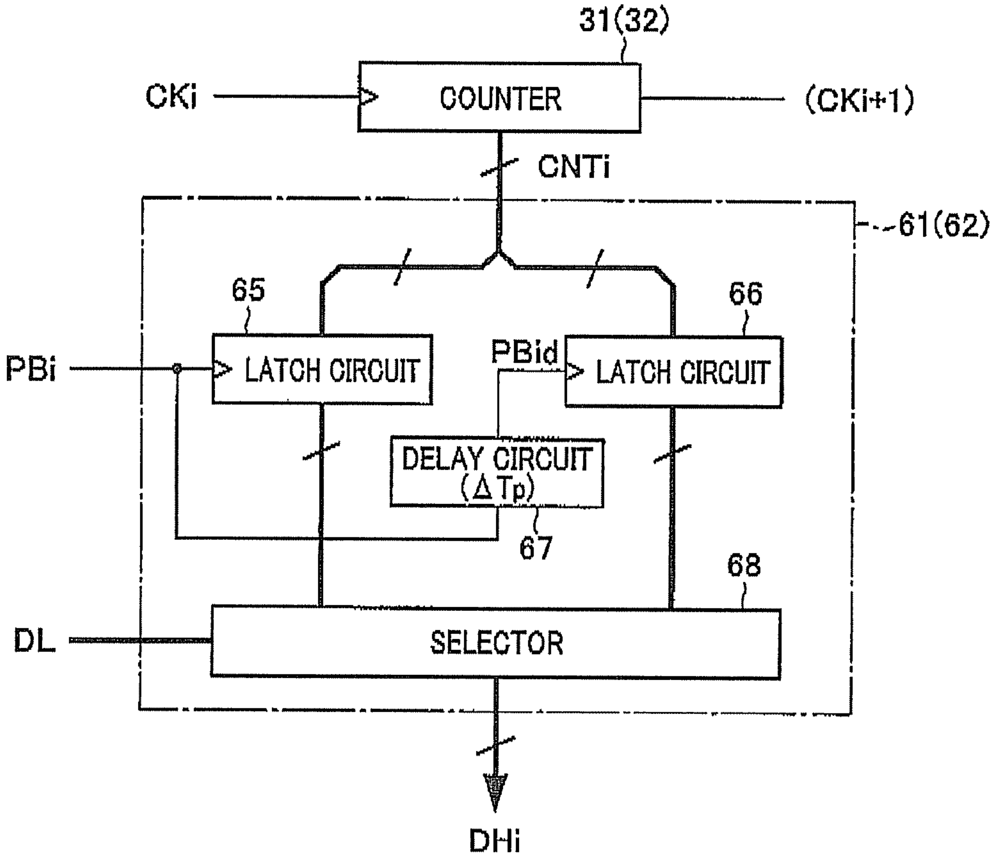
FIG. 2 is a block diagram showing a detailed configuration of a first latch part and a second latch part.

FIG. 2 is a block diagram showing a detailed configuration of the first latch part 61.

As shown in FIG. 2, the first latch part 61 includes a latch circuit 65, a delay circuit 67, a latch circuit 66, and a selector 68. The latch circuit 65 latches the lower count value CNT1 at the timing of the latch pulse PB1. The delay circuit 67 generates a delay latch pulse PB1*d* which is generated by delaying the latch pulse PB1 by delay time ΔTp which is set to the length of a half of the interval between edges of the operation clock CK1. The latch circuit 66 latches the lower count value CNT1 at the timing of the delay latch pulse PB1*d*. The selector 68 selects one of the two latch circuits 65 and 66 according to the value of the lower measurement data DL generated by the encoder 5 (see FIG. 1) and outputs the obtained data as data DH1.

The selector 68 is configured, for example, so as to select an output of the latch circuit 65 if the most significant bit of the lower measurement data DL is "0", and to select an output of the latch circuit 66 if the most significant bit of the lower measurement data DL is "1". Alternatively, the range of value of the lower measurement data DL may be divided into four ranges. If the value of the lower measurement data DL corresponds to the least significant range of value or the most significant range of value, the latch circuit 66 is selected. Otherwise, the latch circuit 65 is selected.

Note that the delay time ΔTp in the delay circuit 67 does not necessarily agree with the length of a half of the interval between edges of the operation clock CK1 accurately. The delay time ΔTp may be longer than the period of time required for determining the signal levels of the outputs of the latch circuits 65 and 66 from the time when the signal levels have started to vary (the period of time during which the signal levels of the outputs are unstable).

The detailed configuration of the first latch part 61 has been described. The configuration of the second latch part 62 is the same as that of the first latch part 61 except that, in the second latch part 62, each of the latch circuits 65 and 66 latches the upper count value CNT2, the delay circuit 67 generates a delay latch pulse PB2*d* which is generated by delaying the latch pulse PB2, and the selector 68 outputs data DH2.

(Operations)

Figure 3:
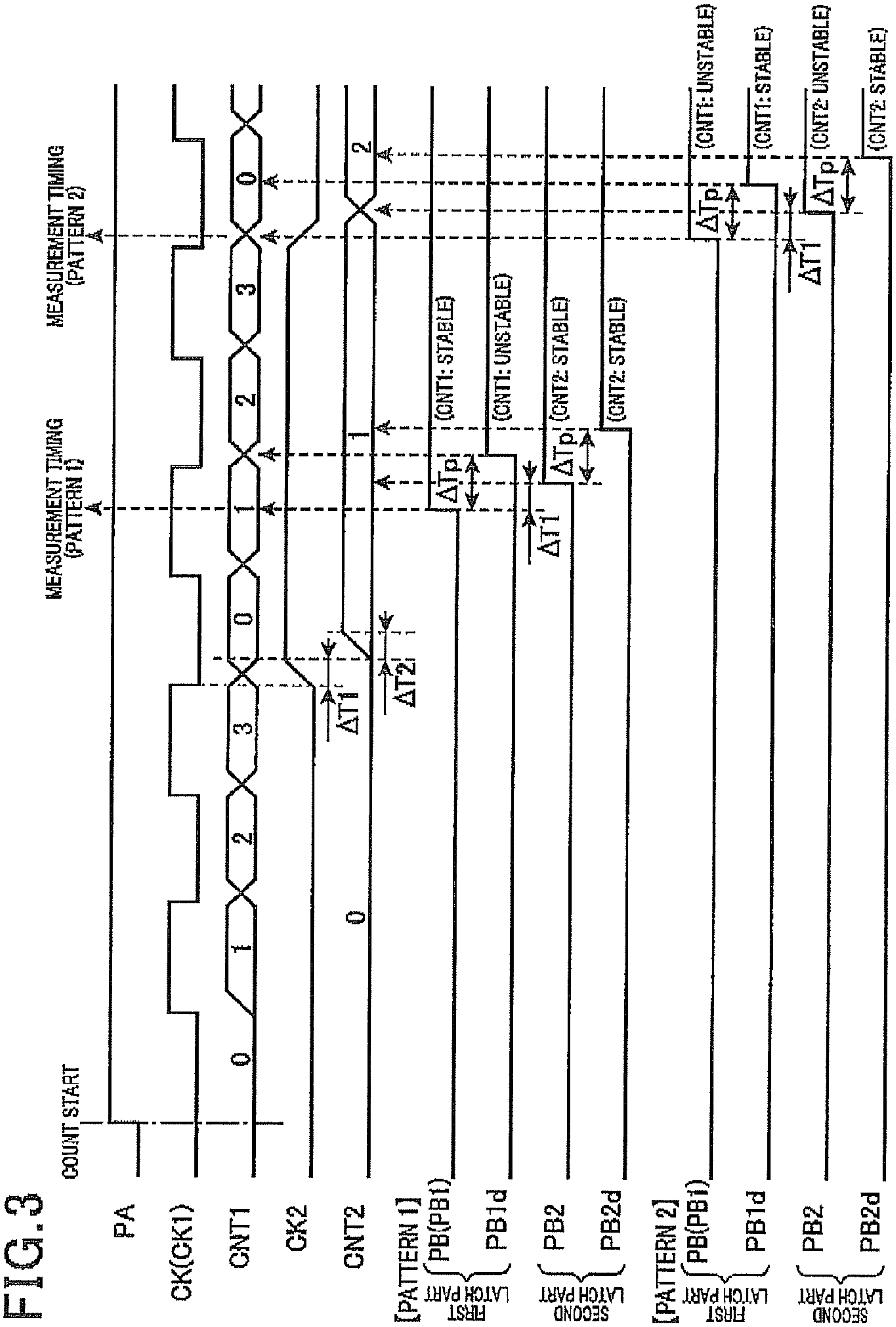
FIG. 3 is a timing diagram showing operations of respective parts of the pulse phase difference coding circuit.

FIG. 3 is a timing diagram showing operations of respective parts of the pulse phase difference coding circuit when the number of digits K1 of the first counter 31 is set to 2.

As shown in FIG. 3, when the pulse for activation PA changes from Low level to High level, the pulse delay circuit 2 starts circulations of the pulse signal and circulates the pulse signal while the pulse for activation PA is High level. The first counter 31 and the second counter 32 configuring the count part 3 count the number of circulations of the pulse signal to output the count values CNT1, CNT2.

Note that the first counter 31 operates with the output CK of the pulse delay circuit 2 used as the operation clock CK1. The second counter 32 operates with the most significant bit of the first counter 31 used as the operation clock CK2.

Thereafter, when the pulse for measurement PB changes from Low level to High level, the first latch part 61 and the second latch part 62 latch count values CNT1, CNT2 of the first counter 31 and the second counter 32 to generate upper measurement data DH (DH1, DH2) representing the number of circulations. The pulse selector 4 detects the position of the pulse signal circulating in the pulse delay circuit 2. The encoder 5 generates lower measurement data DL representing the number of stages of the delay element 2*a* which corresponds to the position of the circulating pulse signal.

In this case, in the first latch part 61, the latch circuit 65 latches the lower count value CNT1 at the timing of the latch pulse PB1. The latch circuit 66 latches the lower count value CNT1 at the timing of the delay latch pulse PB1*d*, that is, at the timing delayed with respect to the latch pulse PB1 by the delay time ΔTp. The first latch part 61 outputs one of the obtained data as the data DH1 according to the lower measurement data DL.

Meanwhile, in the second latch part 62, the latch circuit 65 latches the upper count value CNT2 at the timing of the latch pulse PB2, that is, at the timing delayed with respect to the latch pulse PB1 by the delay time ΔT1. The latch circuit 66 latches the upper count value CNT2 at the timing of the delay latch pulse PB2*d*, that is, at the so timing delayed with respect to the latch pulse PB2 by the delay time ΔTp. As with the first latch part 61, the second latch part 62 outputs one of the obtained data as the data DH2 according to the lower measurement data DL.

Accordingly, the measurement data D (DH, DL) are generated which correspond to the time difference (phase difference) between the rising edge of the pulse for activation PA and the rising edge of the pulse for measurement PB and are outputted to an external unit.

Pattern 1 in FIG. 3 shows a case where the signal level of the pulse for measurement PB varies from low level to High level at the substantial center of the interval between the edges of the output CK of the pulse delay circuit 2. Pattern 2 in FIG. 3 shows a case where the signal level of the pulse for measurement PB varies from low level to High level in the vicinity of the position where the signal level of the output CK of the pulse delay circuit 2 varies.

In the case of Pattern 1, in the first latch part 61, the data latched by the latch circuit 65 (latched with the latch pulse PB1) is stable, and the data latched by the latch circuit 66 (latched with the delay latch pulse PB1*d*) is unstable.

In the second latch part 62, both the data latched by the latch circuit 65 (latched with the latch pulse PB2) and the data latched by the latch circuit 66 (latched with the delay latch pulse PB2*d*) are stable.

In this case, the selectors 68 of the first and second latch parts 61, 62 select data of the latch circuit 65 and output the data as data DH1, DH2.

In the case of Pattern 2, in the first latch part 61, the data latched by the latch circuit 65 (latched with the latch pulse PB1) is unstable, and the data latched by the latch circuit 66 (latched with the delay latch pulse PB1*d*) is stable.

Also in the second latch part 62, the data latched by the latch circuit 65 (latched with the latch pulse PB2) is unstable, and the data latched by the latch circuit 66 (latched with the delay latch pulse PB2*d*) is stable.

In this case, the selectors 68 of the first and second latch parts 61, 62 select data of the latch circuit 66 and output the data as data DH1, DH2.

(Advantages)

As described above, in the pulse phase difference coding circuit 1, the count part 3, which counts the number of circulations of the pulse signal in the pulse delay circuit 2, is configured with a plurality of partial counters (the first counter 31 and the second counter 32). The first counter 31 and the second counter 32 are connected to each other in series so that the most significant bit of the output of the first counter 31 (lower partial counter) serves as the operation clock CK2 of the second counter 32 (upper partial counter). In addition, the second latch part 62, which latches the count value CNT2 of the second counter 32, is operated at the timing delayed with respect to the first latch part 61, which latches the count value CNT1 of the first counter 31, by the delay time ΔT1. Hence, the delay of the operation of the second counter 32 based on the delay of the first counter 31 is compensated.

That is, in the pulse phase difference coding circuit 1, the count part 3 can be configured with the first counter 31, which has a small number of digits by which high-speed operation can be performed, and the second counter 32, which has a large number of digits by which operation speed becomes relatively low. Hence, even when the output CK from the pulse delay circuit 2 has high speed, the count part 3 can be stably operated while ensuring the number of digits of the count values CNT (CNT1, CNT2) required for the count part 3.

Hence, according to the pulse phase difference coding circuit 1, the number of the delay elements 2*a* configuring the pulse delay circuit 2 can be reduced. Accordingly, the circuit size and the power consumption can be reduced without lowering the performance of the pulse phase difference coding circuit 1.

In other words, even when the number of the delay elements 2*a* configuring the pulse delay circuit 2 is limited because, for example, the pulse phase difference, coding circuit 1 is formed on an FPGA, the number of digits of the count part 3 is not limited by the rate of the output CK from the pulse delay circuit 2. Hence, the required precision can be ensured.

In addition, in the pulse phase difference coding circuit 1, each of the first latch part 61 and the second latch part 62 latches a count value CNTi two times at the timings different from each other by delay time ΔTp. Each of the first latch part 61 and the second latch part 62 selects one of the count values CNTi, whose signal level is more stable, based on the position (identified by the output DL of the encoder 5) of a pulse signal circulating in the pulse delay circuit 2, and outputs the selected count value CNTi as data DHi.

Hence, according to the pulse phase difference coding circuit 1, even when the timing of the pulse for measurement PB is inputted at the timing when the count value CNTi varies, the stable measurement data D can be reliably provided, which can improve the reliability of the measurement.

The pulse phase difference coding circuit 1 described above may be used as a time Measurement device which measures the time difference between the pulse for activation PA and the pulse for measurement PB. Each of the delay elements 2*a* configuring the pulse phase difference coding circuit 1 may be configured so that the delay time varies depending on the driving voltage (input signal) applied to the delay element 2*a*, to perform measurement in a state where the phase difference between the pulse for activation PA and the pulse for measurement PB is constant, whereby the pulse phase difference coding circuit 1 is used as an A/D converter measuring the voltage level of the input signal.

In the above embodiment, the count part 3 corresponds to a count means (unit). The pulse selector 4 corresponds to a circulation position detecting circuit. The encoder 5 corresponds to an encoding circuit. The latch circuit 65 corresponds to a first latch circuit. The delay circuit 63 corresponds to a first delay circuit. The latch circuit 66 corresponds to a second latch circuit. The delay circuit 67 corresponds to a second delay circuit. The selector 68 corresponds to a selection means (unit).

It will be appreciated that the present invention is not limited to the configurations described above, but any and all modifications, variations or equivalents, which may occur to those who are skilled in the art, should be considered to fall within the scope of the present invention.

Other Embodiments

In the above embodiment, the count part 3 is configured with two synchronous counters. However, the count part 3 may be configured with three or more synchronous counters. In this case, the i-th latch part, which latches a count value CNTi of the i-th counter, may use a latch pulse PBi obtained by delaying the pulse for measurement PB by the time which is the sum of the delay time in the first to (i−1)-th counters (i.e. ΔT1+ΔT2+ . . . +ΔTi−1).

In addition, in the above embodiment, synchronous counters having a plurality of digits are used as partial counters (the first counter 31, the second counter 32) configuring the count part 3. However, a partial counter in the first stage (first counter 31) may be configured with a 2-dividing circuit (assumed as a synchronous counter having one digit).

In this case, since the first counter 31 can be operated at the highest speed, the number of the delay elements 2*a* configuring the pulse delay circuit 2 can be maximally reduced. In addition, configuring each of the partial counters with a 2-dividing circuit corresponds to configuring the whole of the partial counters with a synchronous counter. In addition, as the number of the partial counters configured with a 2-dividing circuit increases, the circuit configuration of the count part 3 is simplified because a carry circuit of the synchronous counter is not required. Hence, power consumption can also be reduced.

Hereinafter, aspects of the above-described embodiments will be summarized.

In the pulse phase difference coding circuit, the pulse delay circuit is formed by connecting a plurality of delay elements in a ring shape. The pulse delay circuit transmits a pulse signal with the pulse signal being delayed by the delay elements after a pulse for activation representing an activation timing is inputted. The count unit counts the number of circulations of the pulse signal in the pulse delay circuit.

The circulation position detecting unit detects the position of the pulse signal circulating in the pulse delay circuit when a pulse for measurement representing a measurement timing is inputted. The circulation number detecting unit detects the number of circulations of the pulse signal.

Then, the coding unit outputs numeric data representing the number of stages of the delay elements through which the pulse signal has passed in the pulse delay circuit during the time period between the input of the pulse for activation and the input of the pulse for measurement, based on the position of the pulse signal detected by the circulation position detecting unit and the number of circulations detected by the circulation number detecting unit.

In addition, in the pulse phase difference coding circuit, the count unit includes a plurality of partial counters. The partial counters are connected to each other in series so that the most significant bit of an output of the partial counter in the previous stage serves as an operation clock of the partial counter in the subsequent stage. In the circulation number detecting unit, the first latch circuit provided for each of the partial counters latches an output of the each of the partial counters according to the pulse for measurement. Note that the partial counter in the second stage or later is treated as an object counter. The pulse for measurement is inputted into the first latch circuit which latches an output of the object counter. The pulse for measurement is delayed by the first delay circuit by a total delay time in all the partial counters located at the previous stages with respect to the object counter.

That is, when the count unit is configured with a plurality of partial counters, an operation clock of the partial counter in the subsequent stage delays by the delay time in the partial counter in the previous stage (the period of time required for determining the value of the most significant bit from the time when the operation clock is inputted). Hence, the pulse for measurement serving as an operation clock of each of the partial counters is required to be delayed by the delay time.

According to the pulse phase difference coding circuit configured as described above, the count unit can be configured with the partial counters, which have the small number of digits by which high-speed operation can be performed. Hence, the number of the delay elements configuring the pulse delay circuit can be reduced without limiting the number of digits of the count unit. Accordingly, the circuit size and the power consumption can be reduced without lowering the performance of the pulse phase difference coding circuit.

The partial counter is preferably configured with a synchronous counter. The synchronous counter includes a 2-dividing circuit (synchronous counter having one digit). At least one of the partial counters in the first stage may be configured with a 2-dividing circuit. In this case, the pulse delay circuit can be minimized.

Meanwhile, if an input timing of the pulse for measurement and a latch timing of the first latch circuit accidentally agree with each other, the count value can be unstable.

To solve this problem, the circulation number detecting unit may include a second latch circuit which is provided for each of the partial counters and latches an output of the partial counter, a second delay circuit which delays the pulse for measurement so that a latch timing in the second latch circuit is delayed by a delay time set to be half of a circulation time of the pulse signal in the pulse delay circuit with respect to a latch timing in the first latch circuit which latches an output of the same partial counter, and a selection unit which selects between the first latch circuit and the second latch circuit according to a detection result of the circulation position detecting unit so that a result latched when the count value of the partial counter is stable is outputted.

Note that the delay time in the delay circuit is not necessarily required to be just half of circulation time of the pulse signal. The delay time may be longer than the time required for determining the output of the larch circuit.

In this case, which output is stable, the output of the first latch circuit or the output of the second latch circuit, can be estimated from the position of a circulating pulse signal. Hence, according to the above configuration, stable count values can be obtained, which can improve the reliability of the circuit.

Meanwhile, the delay element may be configured so that delay time thereof varies depending on driving voltage applied thereto.

In this case, if measurement is performed in a state where the phase difference between the pulse for activation and the pulse for measurement is constant, numeric data depending on the driving voltage can be obtained, whereby the numeric data can appropriately be used when configuring an AD conversion circuit.

The pulse phase difference coding circuit provides more remarkable advantages when the pulse delay circuit is configured with an FPGA (Field Programmable Gate Array), that is, when the number of the delay elements configuring the pulse delay circuit is limited by the configuration of the FPGA (the size of the circuit which can be arranged in a single logical block).

What is claimed is:

1. A pulse phase difference coding circuit, comprising:

a pulse delay circuit which is formed by connecting a plurality of delay elements in a ring shape, and transmits a pulse signal with the pulse signal being delayed by the delay elements after a pulse for activation representing an activation timing is inputted;

a count unit which counts the number of circulations of the pulse signal in the pulse delay circuit;

a circulation position detecting unit which detects the position of the pulse signal circulating in the pulse delay circuit when a pulse for measurement representing a measurement timing is inputted;

a circulation number detecting unit which detects the number of circulations of the pulse signal in the pulse delay circuit when the pulse for measurement is inputted; and a coding unit which outputs numeric data representing the number of stages of the delay elements through which the pulse signal has passed in the pulse delay circuit during the time period between the input of the pulse for activation and the input of the pulse for measurement, based on the position of the pulse signal detected by the circulation position detecting unit and the number of circulations detected by the circulation number detecting unit; wherein the count unit includes a plurality of partial counters connected to each other in series so that the most significant bit of an output of the previous stage serves as an operation clock of the subsequent stage, and the circulation number detecting unit includes:

a first latch circuit which is provided for each of the partial counters and latches an output of the partial counter according to the pulse for measurement, and a first delay circuit which treats the partial counter in the second stage or later as an object counter and delays the pulse for measurement by a total delay time in all the partial counters located at the previous stages of the object counter, the pulse for measurement being inputted into the first latch circuit which latches an output of the object counter.

2. The pulse phase difference coding circuit according to claim 1, wherein the partial counter is configured with a synchronous counter.

3. The pulse phase difference coding circuit according to claim 2, wherein at least one of the partial counters in the first stage is configured with a 2-dividing circuit.

4. The pulse phase difference coding circuit according to claim 1, wherein the circulation number detecting unit includes:

a second latch circuit which is provided for each of the partial counters and latches an output of the partial counter;

a second delay circuit which delays the pulse for measurement so that a latch timing in the second latch circuit is delayed by a delay time set to be half of a circulation time of the pulse signal in the pulse delay circuit with respect to a latch timing in the first latch circuit which latches an output of the same partial counter; and a selection unit which selects between the first latch circuit and the second latch circuit according to a detection result of the circulation position detecting unit so that a result latched when the count value of the partial counter is stable is outputted.

5. The pulse phase difference coding circuit according to claim 1, wherein the delay element is configured so that delay time thereof varies depending on driving voltage applied thereto.

6. The pulse phase difference coding circuit according to claim 1, wherein the pulse delay circuit is configured with an FPGA (Field Programmable Gate Array).

* * * * *